(12) United States Patent
Lin

(10) Patent No.: US 6,505,327 B2
(45) Date of Patent: Jan. 7, 2003

(54) GENERATING AN INSTANCE-BASED REPRESENTATION OF A DESIGN HIERARCHY

(75) Inventor: Chin-hsen Lin, Fremont, CA (US)

(73) Assignee: Numerical Technologies, Inc., San Jose, CA (US)

( * ) Notice: Subject to any disclaimer, the term of this patent is extended or adjusted under 35 U.S.C. 154(b) by 32 days.

(21) Appl. No.: 09/835,313

(22) Filed: Apr. 13, 2001

(65) Prior Publication Data
US 2002/0152449 A1 Oct. 17, 2002

(51) Int. Cl.[7] .............................................. G06F 17/50
(52) U.S. Cl. ........................................................ 716/5
(58) Field of Search ............................. 716/5, 6, 7, 8, 716/9, 12, 16

(56) References Cited

U.S. PATENT DOCUMENTS

| 5,182,718 A | 1/1993 | Harafuji et al. ............. 364/490 |
| 5,432,714 A | 7/1995 | Chung et al. ................ 364/525 |
| 5,533,148 A | 7/1996 | Sayah et al. ................. 382/240 |
| 5,538,815 A | 7/1996 | Oi et al. .......................... 430/5 |
| 5,631,110 A | 5/1997 | Shioiri et al. ................... 430/5 |
| 5,657,235 A | 8/1997 | Liebmann et al. ...... 364/474.24 |
| 5,682,323 A | 10/1997 | Pasch et al. ................. 364/491 |

(List continued on next page.)

FOREIGN PATENT DOCUMENTS

| JP | 3-80525 | 4/1991 |
| WO | WO 97/38381 | 10/1997 |
| WO | WO 99/14636 A1 | 3/1999 |
| WO | WO 99/14637 A1 | 3/1999 |
| WO | WO 99/14638 A1 | 3/1999 |
| WO | WO 02/29491 A1 | 4/2002 |

OTHER PUBLICATIONS

Hirai, Y., et al., "Automatic Pattern Generation System for Phase Shfiting Mask", 1991 Symposium on VLSI Technology, Digest of Technical Papers, pp. 95–96, May 28–30, 1991.

Wong, A., et al., "Investigating Phase–Shifting Mask Layout Issues Using a Cad Toolkit", IEEE, pp. 27.4.1–27.4.4 (1991).

Moniwa, A., et al., "Algorithm for Phase–Shift Mask Design with Priority on Shifter Placement", Jpn. J. Appl. Phys., vol. 32, Pt. 1, No. 12B, pp. 5874–5879, Dec. 1193.

(List continued on next page.)

Primary Examiner—David Nelms
Assistant Examiner—Quoc Hoang
(74) Attorney, Agent, or Firm—Park, Vaughan & Fleming LLP

(57) ABSTRACT

One embodiment of the invention provides a system for generating an instance-based representation of a set of geometrical features that comprise a layout of a circuit on a semiconductor chip. This system operates by receiving a design hierarchy specifying the layout of the circuit, wherein the design hierarchy includes a set of hierarchically organized nodes. Within this design hierarchy, a given node specifies a geometrical feature, which can be comprised of lower-level geometrical features. These lower-level geometrical features are represented by lower-level nodes that appear under the given node in the design hierarchy. Furthermore, the layout of the given node is specified by a first cell, which in turn specifies the layout of one or more nodes in the design hierarchy. For each node within the design hierarchy, the system determines how interactions with the node's siblings and/or parent, and possibly other surrounding geometries, change the layout of the node as specified by the first cell. If the changes result in a new node for which no instance has been created, the system creates a new instance for the node.

28 Claims, 9 Drawing Sheets

U.S. PATENT DOCUMENTS

| | | | | |
|---|---|---|---|---|
| 5,806,056 | A | * | 9/1998 | Hekmatpour .................. 706/50 |
| 5,815,685 | A | | 9/1998 | Kamon ........................ 395/500 |
| 5,847,959 | A | | 12/1998 | Veneklasen et al. ... 364/468.28 |
| 5,885,734 | A | | 3/1999 | Pierrat et al. ................... 430/5 |
| 5,923,566 | A | | 7/1999 | Galan et al. ................. 364/489 |
| 6,009,250 | A | | 12/1999 | Ho et al. ............... 395/500.06 |
| 6,009,251 | A | | 12/1999 | Ho et al. ............... 395/500.06 |
| 6,011,911 | A | | 1/2000 | Ho et al. ............... 395/500.06 |
| 6,064,806 | A | | 5/2000 | Lakos et al. ........... 395/500.04 |
| 6,077,310 | A | | 6/2000 | Yamamoto et al. ........... 716/19 |
| 6,081,658 | A | | 6/2000 | Rieger et al. .......... 395/500.22 |
| 6,339,836 | B1 | * | 1/2002 | Eisenhofer et al. ............ 716/5 |
| 6,370,679 | B1 | | 4/2002 | Chang et al. ................. 716/19 |
| 2002/0010904 | A1 | | 1/2002 | Ayres .......................... 716/19 |

OTHER PUBLICATIONS

Ooi, K., et al., "Computer Aided Design Software for Designing Phase–Shifting Masks", Jpn. J. Appl. Phys., vol. 32, Pt. 1, No. 12B, pp. 5887–5891, Dec. 1993.

Moniwa, A., et al., "Heuristic Method for Phase–Conflict Minimization in Automatic Phase–Shift Mask Design", Jpn. J. Appl. Phys., vol. 34, Pt. 1, No. 12B, pp. 6584–6589, Dec. 1995.

Harafuji, K. et al., "A Novel Hierarchical Approach For Proximity Effect Correction In Electron Beam Lithography", *IEEE*, vol. 12, No. 10, pp. 1508–1514, Oct. 1993.

Rieger, M. et al., "System For Lithography Proximity Compensation", Precim Company, Portland, Oregon, Sep. 1993 (28 pages).

Rieger, M. et al., "Using Behavior Modeling For Proximity Correction", Precim Company, Portland, Oregon (6 pages).

Stirniman, J. et al., "Wafer Proximity Correction And Its Impact On Mask–Making", *Bacus News,* vol. 10, Issue 1, pp. 1, 3–7, 10–12, Jan. 1994.

Lithas, "Lithas: Optical Proximity Correction Software"(2 pages).

Galan, G., et al., "Application of Alternating–Type Phase Shift Mask to Polysilicon Level for Random Logic Circuits", Jpn. J. Appl. Phys., vol. 33, pp. 6779–6784 (1994).

Tsujimoto, E., et al., "Hierarchical Mask Data Design System (PROPHET) for Aerial Image Simulation, Automatic Phase–Shifter Placement, and Subpeak Overlap Checking", SPIE, vol. 3096, pp. 163–172 (1997).

Yamamoto, K., et al., "Hierarchical Processing of Levenson–Type Phase Shifter Generation", Jpn. J. Appl. Phys., vol. 36, Part 1, No. 12B, pp. 7499–7503, Dec. 1997.

* cited by examiner

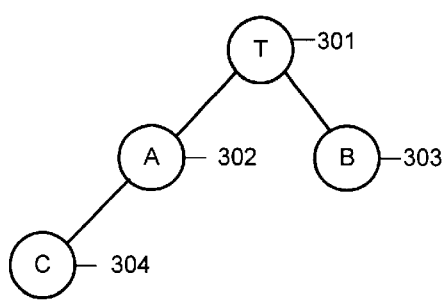
FIG. 3A
(PRIOR ART)
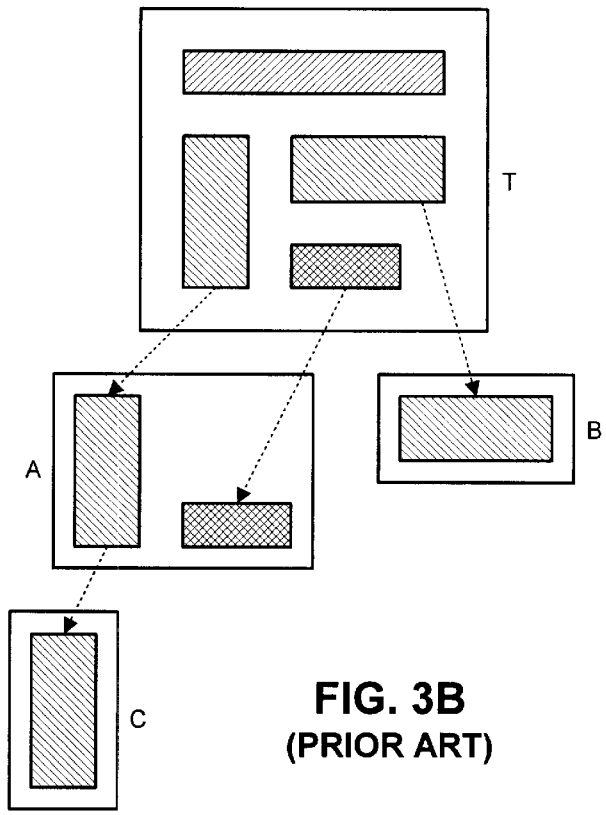
FIG. 3B
(PRIOR ART)
```
T
{
    REF LIST AT_A, BT_B
}
A
{
    ▨▨▨▨▨
    REF LIST CT_CA
}
B
{
    ▨▨
}
C
{
    ▨
}
```
FIG. 3C
(PRIOR ART)

GENERATING AN INSTANCE-BASED REPRESENTATION OF A DESIGN HIERARCHY

BACKGROUND

1. Field of the Invention

The invention relates to the process of designing an integrated circuit. More specifically, the invention relates to a method and an apparatus for generating an instance-based representation of a set of geometrical features that comprise a layout of a circuit on a semiconductor chip in order to speed up subsequent operations on the layout.

2. Related Art

Recent advances in integrated circuit technology have largely been accomplished by decreasing the feature size of circuit elements on a semiconductor chip. As the feature size of these circuit elements continues to decrease, circuit designers are forced to deal with problems that arise as a consequence of the optical lithography process that is typically used to manufacture integrated circuits. This optical lithography process generally begins with the formation of a photoresist layer on the surface of a semiconductor wafer. A mask composed of opaque regions, which are generally formed of chrome, and light-transmissive clear regions, which are generally formed of quartz, is then positioned over this photo resist layer coated wafer. (Note that the term "mask" as used in this specification is meant to include the term "retical.") Light is then shone on the mask from a visible light source or an ultraviolet light source.

This light is generally reduced and focussed through an optical system that contains a number of lenses, filters and mirrors. The light passes through the clear regions of the mask and exposes the underlying photoresist layer. At the same time, the light is blocked by opaque regions of mask, leaving underlying portions of the photoresist layer unexposed.

The exposed photoresist layer is then developed, typically through chemical removal of the exposed/non-exposed regions of the photoresist layer. The end result is a semiconductor wafer with a photoresist layer having a desired pattern. This pattern can then be used for etching underlying regions of the wafer.

One problem that arises during the optical lithography process is "line end shortening" and "pullback". For example, the upper portion of FIG. 1 illustrates a design of a transistor with a polysilicon line 102, running from left to right, that forms a gate region used to electrically couple an upper diffusion region with a lower diffusion region. The lower portion of FIG. 1 illustrates the actual printed image that results from the design. Note that polysilicon line 102 has been narrowed using optical phase shifting in order to improve the performance of the transistor by reducing the resistance through the gate region.

Also note that because of optical effects and resist pullback there is a significant amount of line end shortening. This line end shortening is due to optical effects that cause the light to expose more of the resist under a line end than under other portions of the line.

In order to compensate for line end shortening, designers often add additional features, such as "hammer heads," onto line ends (see top portion of FIG. 2). As is illustrated in the bottom portion FIG. 2, these additional features can effectively compensate for line end shortening in some situations.

These additional features are typically added to a layout automatically during a process known as "optical proximity correction" (OPC). However, the optical proximity correction process can be complicated by the fact that a layout for a semiconductor chip is often stored in a standard hierarchical format, such as GDSII stream format.

For example, FIGS. 3A, 3B and 3C illustrate how a layout, T, can be composed of a sub-cell A and a sub-cell B, wherein the sub-cell A further includes a sub-cell C. FIG. 3A illustrates a nodal representation of this hierarchy and FIG. 3B illustrates a corresponding graphical representation.

FIG. 3C presents a specification of the layout in code form. In this form, the layout, T, includes a reference list. This reference list includes a reference to cell A along with an associated transformation, $T_A$, and a reference to cell B along with an associated transformation, $T_B$. Similarly, the layout for cell A includes geometrical features associated with cell A along with a reference cell C. This reference to cell C is accompanied by a transformation of cell C with respect to A, $T_{CA}$. The layouts for cell B and cell C include geometrical features associated with cell B and cell C, respectively.

One problem with applying OPC to a hierarchical representation of a layout is that interactions between nodes within the hierarchical representation can cause erroneous correction can take place. For example, referring to FIG. 4, a cell T, is composed of a cell A and a cell B. However, if OPC is applied to cell A and cell B separately within the hierarchical representation, bogus corrections can take place as is illustrated in step 3.

Note that these bogus corrections are unnecessary because the neighboring cells A and B eliminate the need for the hammerheads between the cells A and B. In order to remove these bogus corrections, an additional bogus correction removal step 4 is required. This bogus correction removal step may be accomplished by storing "negative features" to erase the bogus features at various nodes within the hierarchy.

Another way to eliminate the bogus correction problem is to collapse the hierarchy down into a single monolithic layout, and then to apply OPC to the single monolithic layout. Unfortunately, this technique can be prohibitively slow because OPC must be applied to the entire layout.

In contrast, by using a hierarchical form of the layout, once OPC is applied to the layout of a specific cell, the result can be applied to all instances of the cell without repeating the OPC process for each cell. Unfortunately, interactions with neighboring nodes and parent nodes can cause the above-described bogus correction problems.

What is needed is a method and an apparatus for performing a computational operation, such as OPC, on a hierarchical representation of a layout without performing the computational operation over the entire layout, and without the above-described problems associated with using a hierarchical representation.

SUMMARY

One embodiment of the invention provides a system for generating an instance-based representation of a set of geometrical features that comprise a layout of a circuit on a semiconductor chip. This system operates by receiving a design hierarchy specifying the layout of the circuit, wherein the design hierarchy includes a set of hierarchically organized nodes. Within this design hierarchy, a given node specifies a geometrical feature, which can be comprised of lower-level geometrical features. These lower-level geometrical features are represented by lower-level nodes that appear under the given node in the design hierarchy.

Furthermore, the layout of the given node is specified by a first cell, which in turn specifies the layout of one or more nodes in the design hierarchy. For each node within the design hierarchy, the system determines how interactions with the node's siblings and/or parent, and possibly with other surrounding geometries, change the layout of the node as specified by the first cell. If the changes result in a new node for which no instance has been created, the system creates a new instance for the node.

In one embodiment of the invention, the system additionally collapses the design hierarchy, so that each node in the design hierarchy is represented by a specific node instance that is not affected by higher-level or neighboring nodes in the design hierarchy. Note that a given node is said to be "affected" by high-level or neighboring nodes if other instances of the given node have different geometries within a proximity region around the other instances.

In one embodiment of the invention, the system additionally performs an analysis on each node instance within the instance-based representation of the layout without having to consider effects of higher-level or neighboring nodes in the design hierarchy. In a variation on this embodiment, the analysis involves performing design rule checking on the layout. In another variation, the analysis involves performing optical proximity correction on the layout. In yet another variation, the analysis involves partitioning the layout so that different instances can be processed by different threads executing in parallel.

In one embodiment of the invention, the system additionally replaces each node in the design hierarchy with three cells, including: a holding cell that replaces the node in the design hierarchy; a physical cell under the holding cell that specifies environmental attributes and areas of interest for the node; and an actual cell under the holding cell.

In one embodiment of the invention, the system additionally determines whether the instance-based representation reduces an amount of layout that must be analyzed below a threshold value. If not, the system uses another representation of the layout instead of the instance-based representation in subsequent analysis operations.

In one embodiment of the invention, the environmental attributes specified by the parent of the node include geometrical features to be added to the node and to the node's siblings.

In one embodiment of the invention, the design hierarchy is specified in GDSII format.

BRIEF DESCRIPTION OF THE FIGURES

FIG. 3A illustrates a hierarchical representation of a layout in nodal form.

FIG. 3B illustrates a hierarchical representation of the layout in graphical form.

FIG. 3C illustrates a hierarchical representation of the layout in code form.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Performing OPC on and Instance-Based Layout

Figure 1:
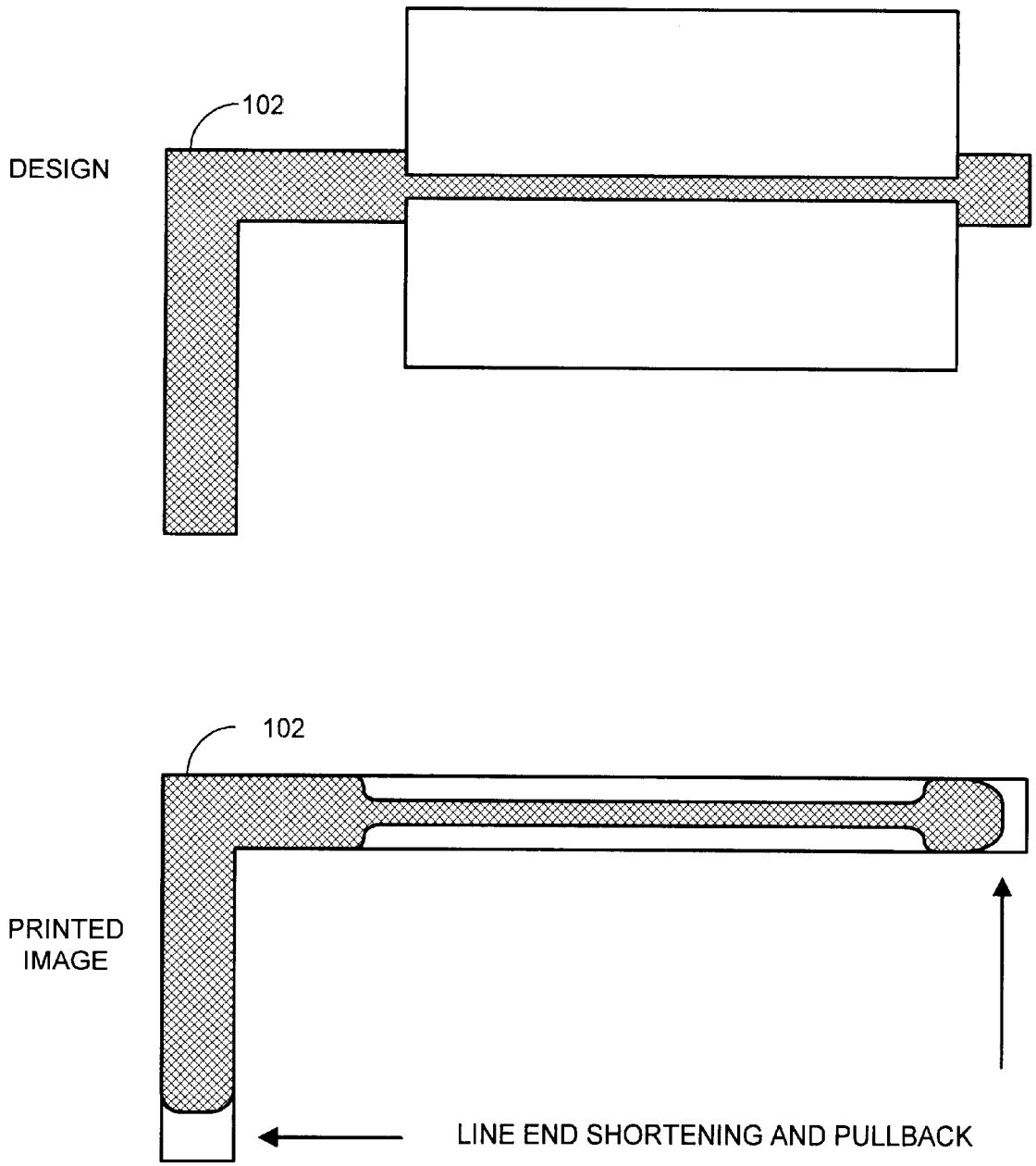
FIG. 1 illustrates the line end shortening problem.
Figure 2:
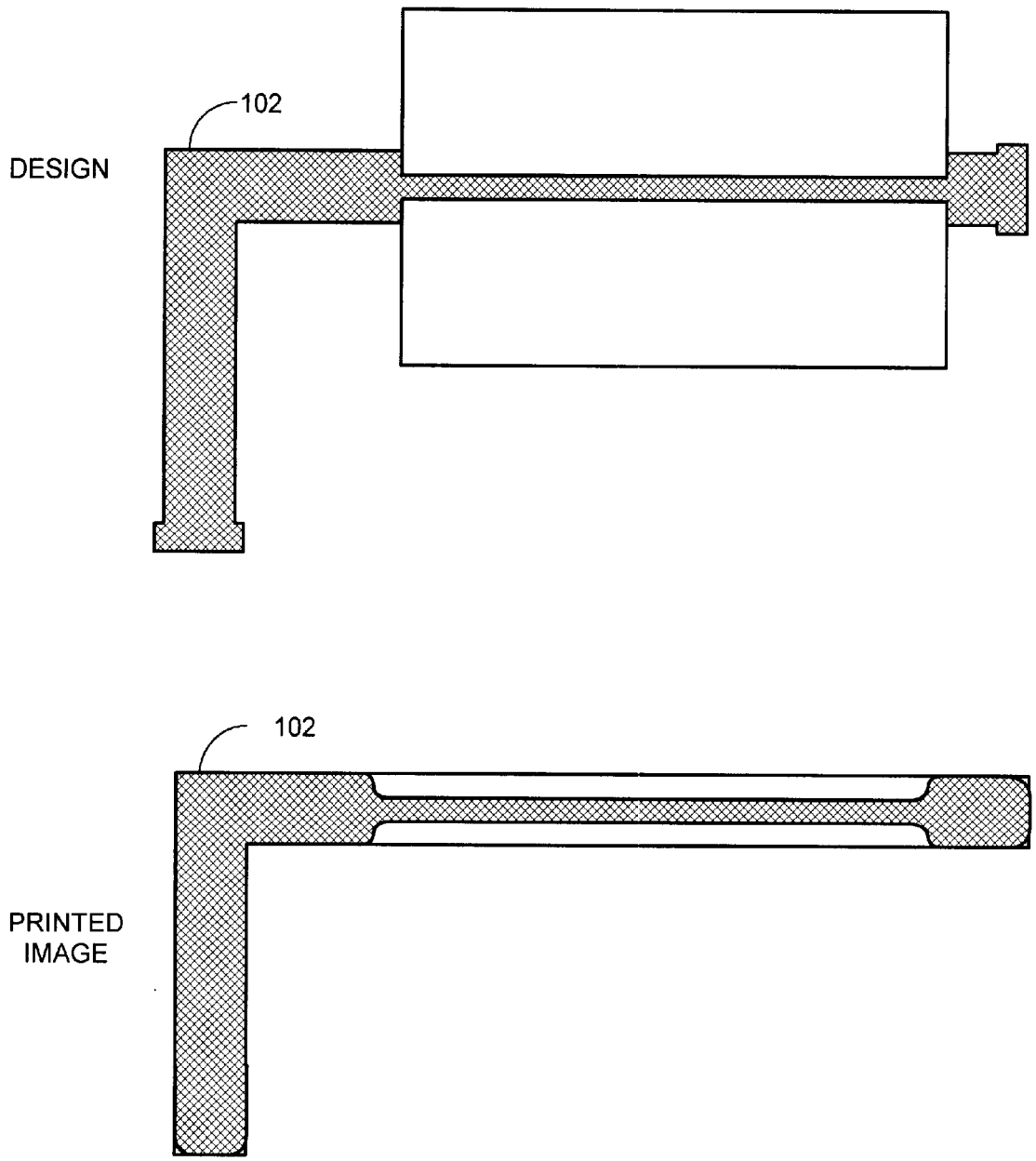
FIG. 2 illustrates the use of hammer heads to compensate for the line end shortening problem.
Figure 4:
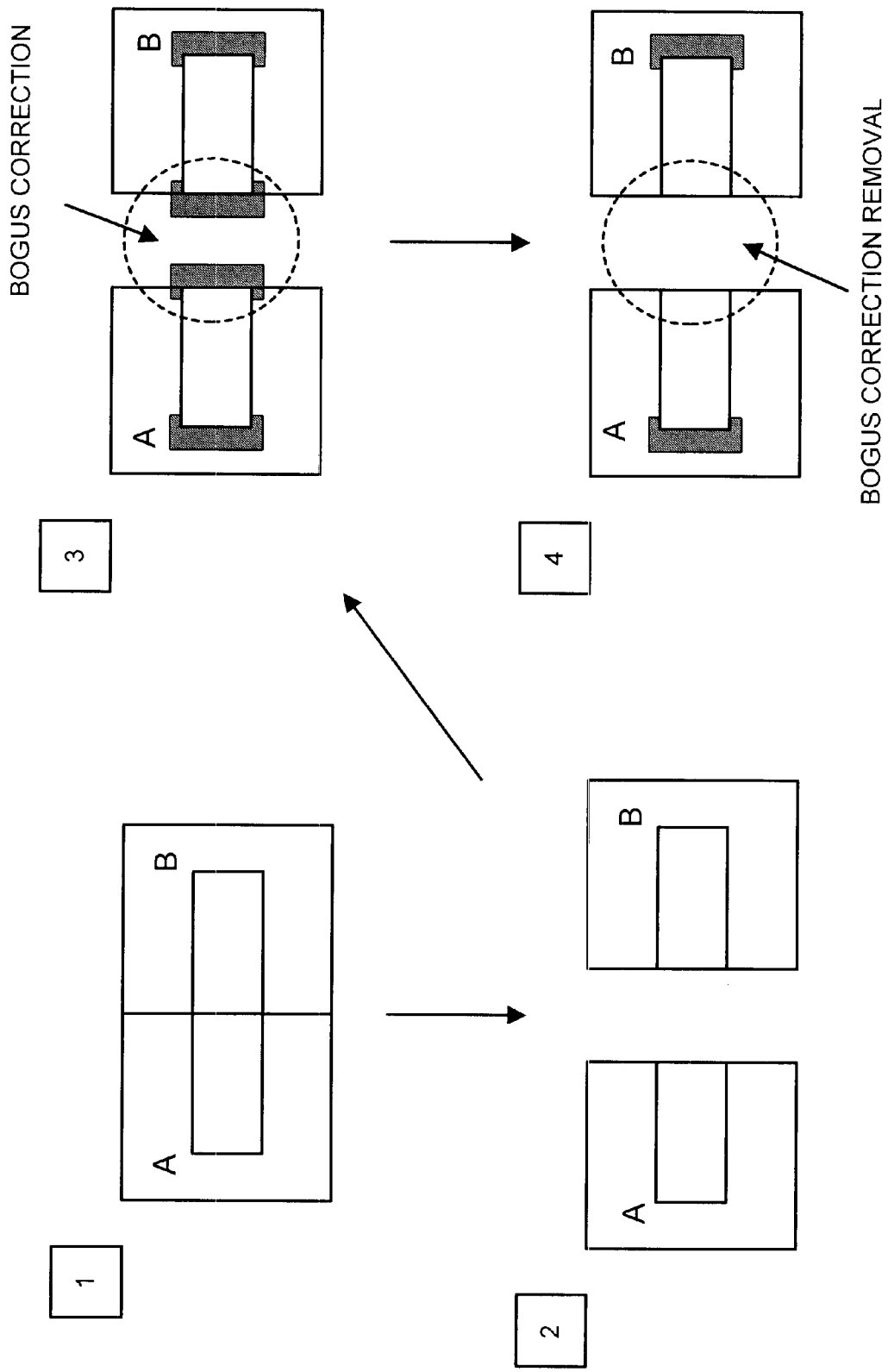
FIG. 4 illustrates the bogus correction problem that can arise during optical proximity correction on a hierarchical layout.
Figure 5:
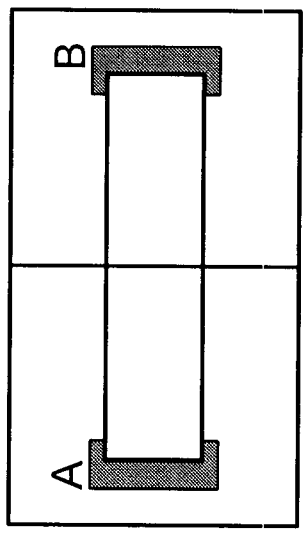
FIG. 5 illustrates how optical proximity correction operates on an instance-based representation in accordance with an embodiment of the invention.
Figure 5:
Figure 5:
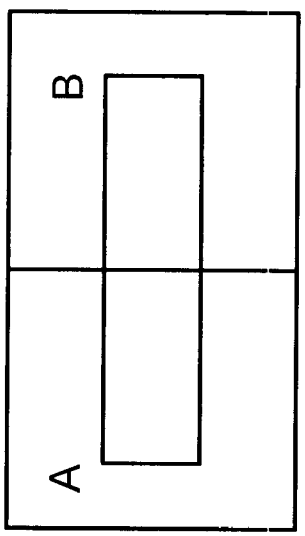

FIG. 5 illustrates how optical proximity correction operates on an instance-based representation in accordance with an embodiment of the invention. OPC operates on the instance-based representation by considering cell A to be an instance of A, wherein the instance specifies attributes of a neighboring cell B that affect OPC for A. Similarly, cell B is considered an instance of cell B, wherein the instance specifies attributes of the neighboring cell A that influence OPC for B. Note that other instances of the cell A may not have a neighboring cell B, and other instances of the cell B may not have a neighboring cell A.

When OPC takes place for the instance of cell A illustrated in FIG. 5, no hammerhead is generated at the border between cell A and cell B because the instance of cell A includes information that accounts for the influence of cell B. For similar reasons, when OPC takes place for the instance of cell B illustrated in FIG. 5, no hammerhead is generated at the border between cell B and cell A.

The process of generating an instance-based representation for a layout is described in more detail below with reference to FIGS. 6–9.

IC Design Process

Figure 6:
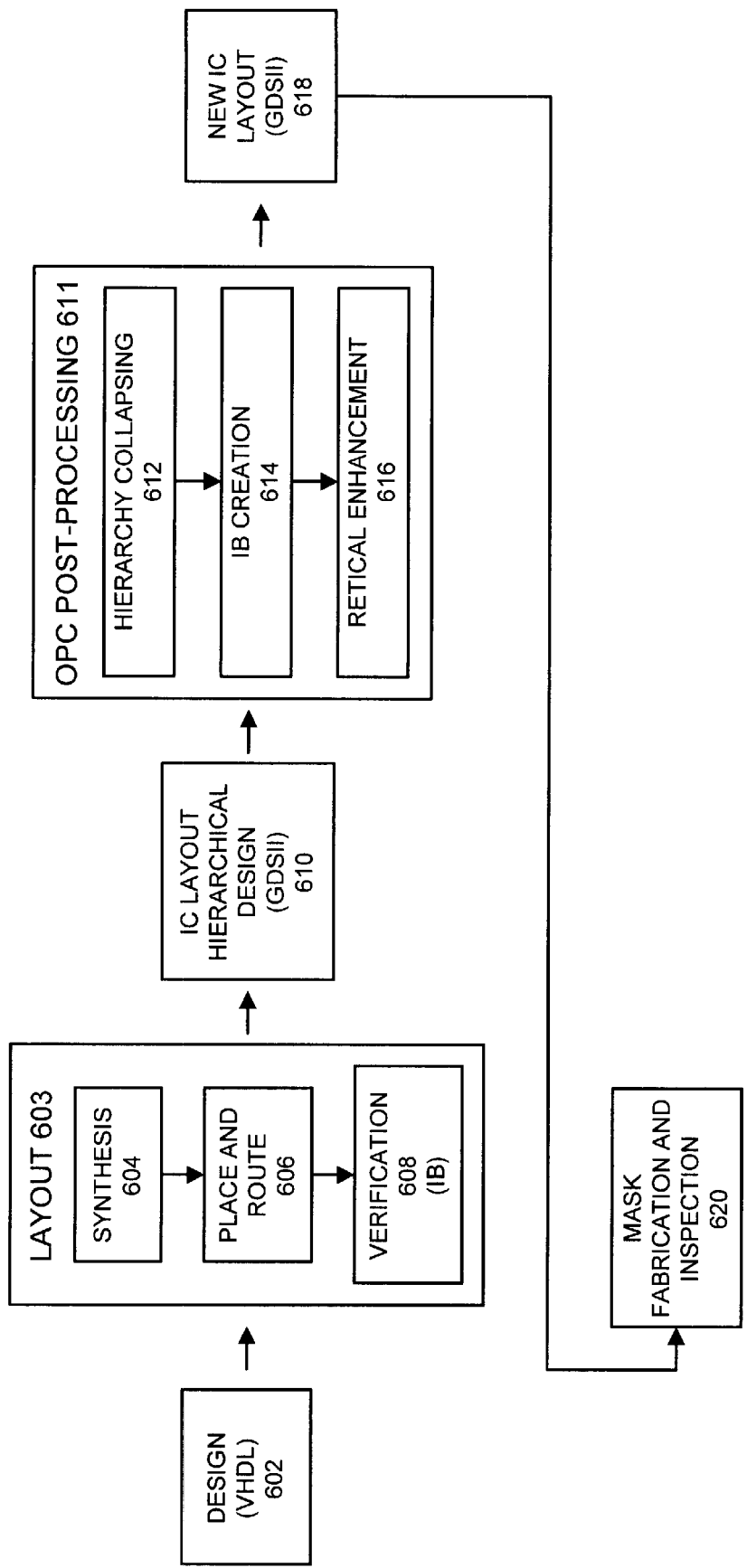
FIG. 6 illustrates a design process for an integrated circuit that involves generating an instance-based representation of a circuit layout in accordance with an embodiment of the invention.

FIG. 6 illustrates a design process for an integrated circuit that involves generating an instance-based representation of a layout in accordance with an embodiment of the invention. This process starts when a circuit designer produces a design 602 in VHDL, or some other hardware description language. VHDL is an acronym for VHSIC Hardware Description Language. (VHSIC is a Department of Defense acronym that stands for very high-speed integrated circuits.) The VHDL standard has been codified in Institute for Electrical and Electronic Engineers (IEEE) standard 1076-1993.

Layout 602 then feeds through a layout system that performs a number of functions, such as synthesis 604, placement and routing 606 and verification 608. The result is an integrated circuit (IC) layout 610, which is in the form of a hierarchical specification expressed in a format such as GDSII.

IC layout 610 then passes into OPC post-processing system 611, which performs a number of functions, such as hierarchy collapsing 612, instance-based representation creation 614 and retical enhancement 616.

The output of OPC post-processing system 611 is a new IC layout 618. New IC layout 618 subsequently passes into mask fabrication and inspection processes 620.

Note that an instance-based (IB) representation can generally be used for any type of processing that involves examining the geometries of the layout. This includes any simulation utilizing the geometries or any other use of the geometries. For example, an IB representation can be used to perform design rule checking at the end of the layout process 603. An IB representation can also be used to perform OPC, as well as subsequent processing operations.

Modifying the Design Hierarchy

Figure 7A:
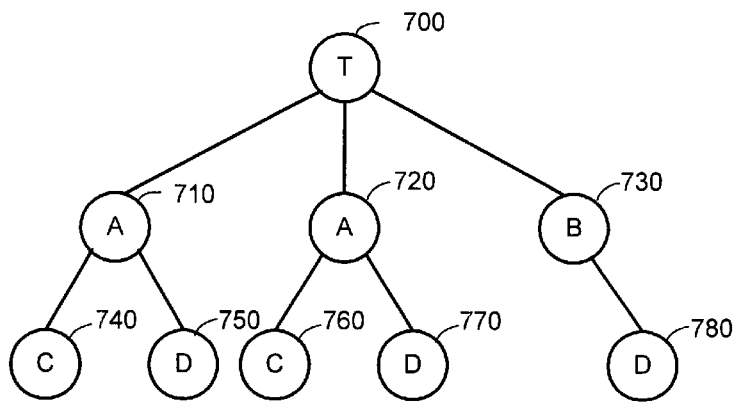
FIG. 7A illustrates a design hierarchy for a layout.

FIG. 7A illustrates a design hierarchy for a layout T 700. Layout T 700 includes two instances of the cell A, 710 and 720, as well as an instance of cell B 730. The first instance of the cell A 710 includes an instance of the cell C 740 and an instance of the cell D 750. Similarly, the second instance of the cell A includes an instance of the cell C 760 and an instance of the cell D 770. Cell B 730 includes an instance of the cell D 780.

Figure 7B:
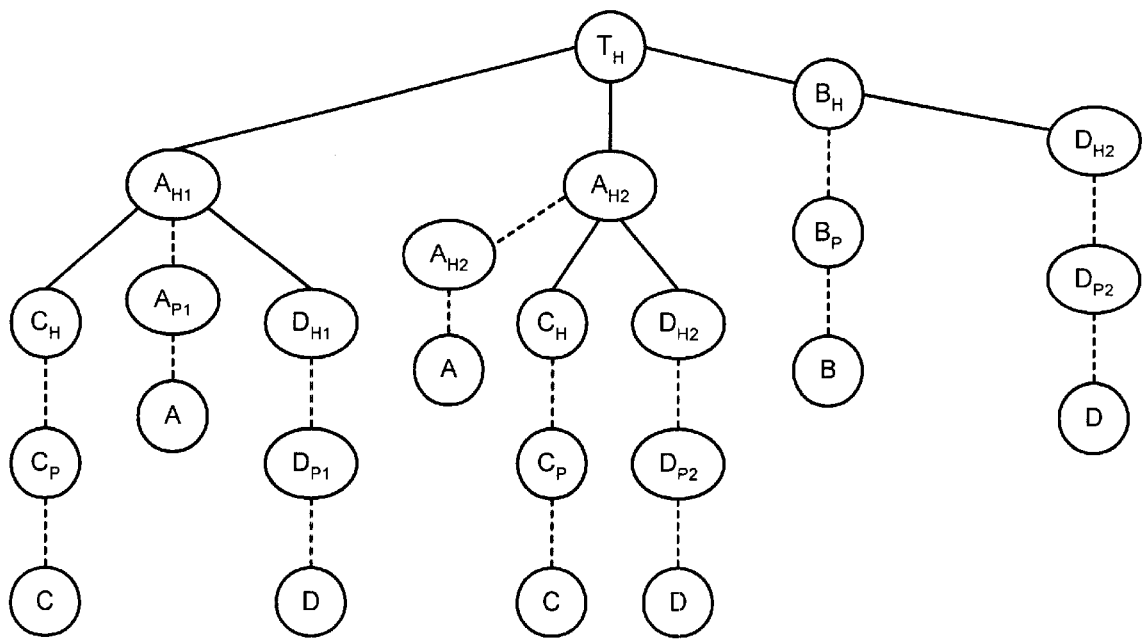
FIG. 7B illustrates a modified design hierarchy for the layout in accordance with an embodiment of the invention.

FIG. 7B illustrates a modified design hierarchy for a layout in accordance with an embodiment of the invention. It is convenient to use this modified representation in generating the instance-based representation of the layout because the modified representation allows each node to encapsulate environmental information from its parent node as well as neighboring nodes.

This modified hierarchy is generated by replacing each node in the original hierarchical representation (as illustrated in FIG. 7A) with three nodes, including a holding cell, a physical cell and an actual cell. The holding cell acts as a placeholder for the original cell. The physical cell contains information on environmental factors from a parent node or neighboring nodes that affect the node. For example, these environmental factors can include, geometries, connectivity information, netlist information and/or information on coloring schemes. The physical cell also specifies areas of interest for the node. Finally, the actual cell can include the original cell.

The basic rule is that physical cells do not point to each other. In some cases, a holding cell and a physical cell can be merged into a single cell, so long as the basic rule is not violated.

Generating an Instance-Based Representation

Figure 8:
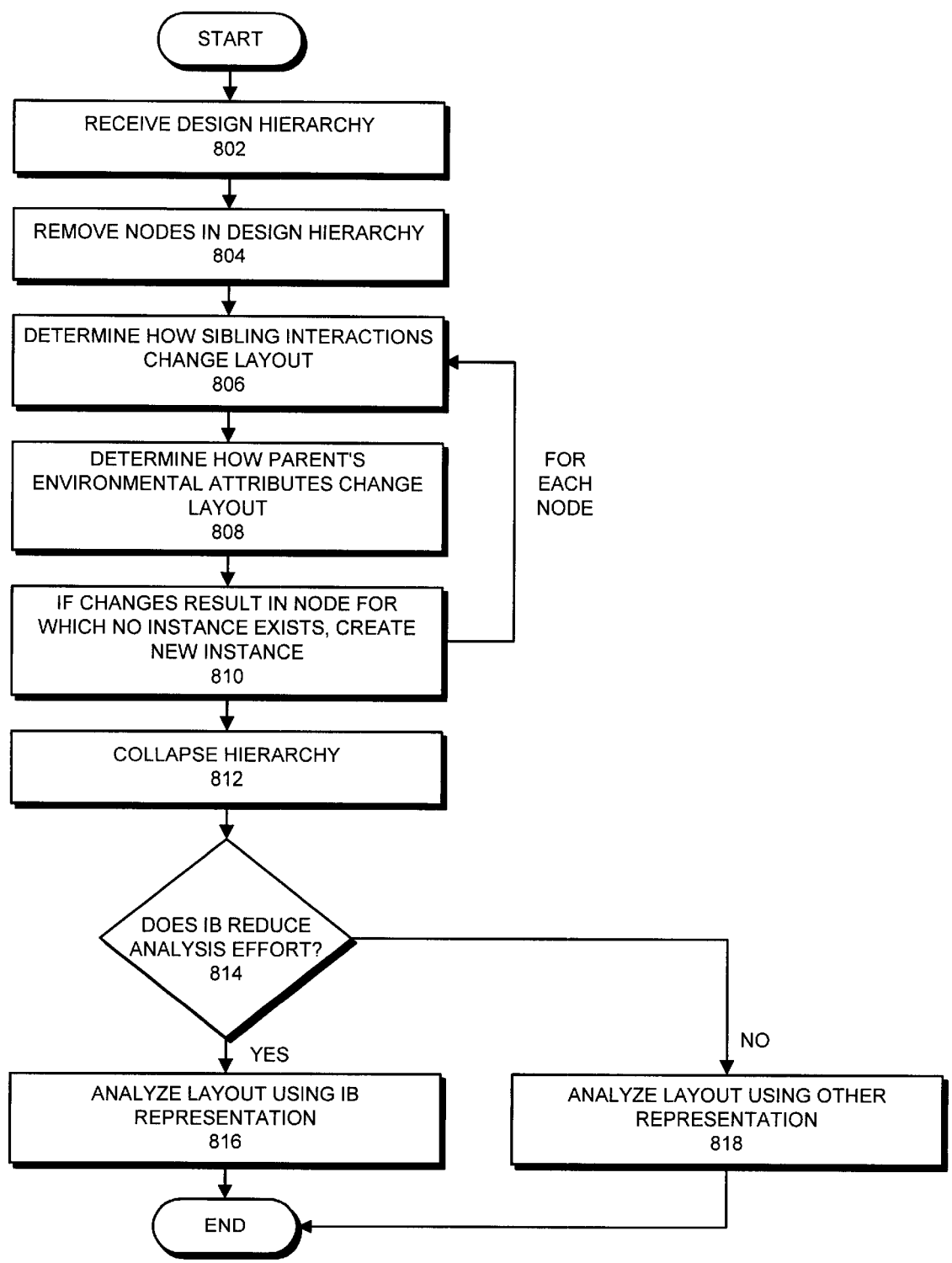
FIG. 8 is a flow chart illustrating the process of generating an instance-based representation from a hierarchical representation in accordance with an embodiment of the invention.

FIG. 8 is a flow chart illustrating the process of generating an instance-based representation from a hierarchical representation in accordance with an embodiment of the invention. The process starts by receiving a design hierarchy specifying the layout of the circuit (step 802). The system then replaces nodes in the hierarchy as is illustrated in FIG. 7 (step 804).

Next, for each node in the hierarchy, the system determines how interactions with siblings change the layout of the node (step 806). For example, a geometrical feature within a sibling node may cause a coloring conflict or a design rule violation that has to be remedied by modifying the layout of the node. The system also determines how the parent's environmental attributes change the layout (step 808). For example, in FIG. 9 a geometrical feature 902 defined within parent node 700 may cause a coloring conflict or design rule violation that must be remedied by changing the layout of the node. Finally, if any of these changes result in a new instance for which no instance has been created, the system creates a new instance (step 810).

In one embodiment of the invention, during the above-described process, the nodes are visited in topological order. This ensures that all instances of a parent node are created before a child node is analyzed.

In one embodiment of the invention, all instances of a master cell are generated before going on to the next cell.

Next, the design hierarchy is collapsed so that only the instances remain (step 812).

Note that an IB representation will not necessarily reduce the amount of layout that must be considered during subsequent analysis operations. For example, if instances are not repeated in a layout, the total layout area that must be analyzed is not reduced by using an IB representation. Therefore, it may be more efficient to use other representations in some situations.

In order to deal with these situations, the system additionally determines whether the IB representation will reduce analysis effort below a threshold value (step 814). If so, the system performs an analysis, such as OPC, on the layout using the IB representation (step 816). Otherwise, the system performs the analysis on the layout using another representation, e.g. a flat, non-hierarchical, representation (step 818).

Note that given any point (x,y) in a layout, there is one and only one unique instance associated with that point (x,y) in the layout. Furthermore, the union of the instances is equivalent to the layout.

Example Hierarchical Layout

Figure 9:
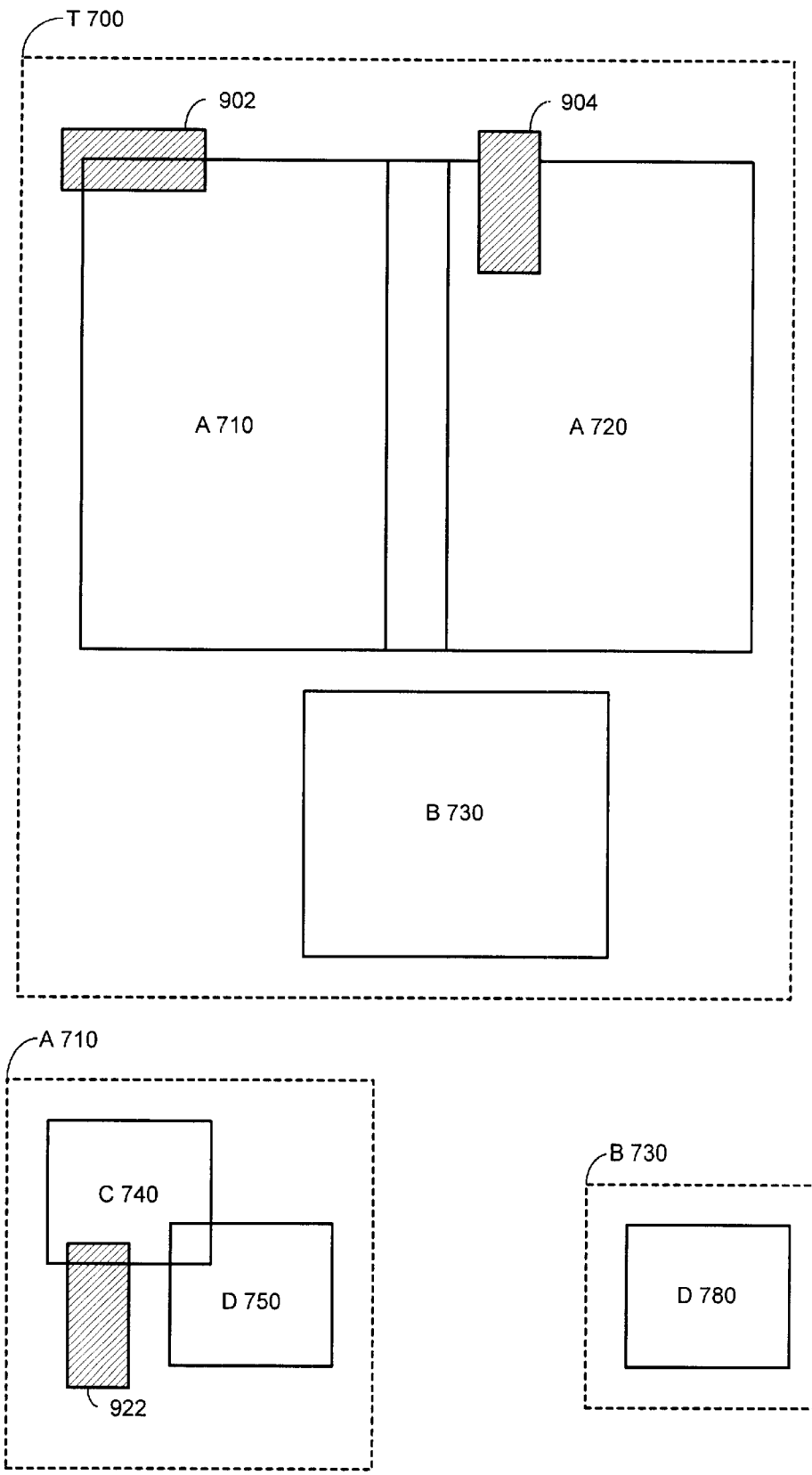
FIG. 9 presents an example of a hierarchical layout in accordance with an embodiment of the invention.

FIG. 9 presents an example of a hierarchical layout in accordance with an embodiment of the invention. This layout is a graphical representation of the layout illustrated in FIG. 7A. Within FIG. 9, a layout T 700 includes two instances of the cell A, 710 and 720, as well as an instance of the cell B 730. The first instance of the cell A 710 includes an instance of the cell C 740 and an instance of the cell D 750. The second instance of cell A 720 (not shown in FIG. 9) includes an instance of the cell C 760 and an instance of the cell D 770. Cell B 730 also includes an instance of the cell D 780.

In this graphical representation, layout T 700 includes two geometrical features 902 and 904 in additional to cells A 710, A 720 and B 730. Note that geometrical feature 902 affects the layout of cell A 710, and that geometrical feature 904 affects the layout of cell A 720. Also note that cell A 710 may affect the layout of neighboring cell A 720. Similarly, cell A 720 may affect the layout of neighboring cell A 710.

Consequently the system creates two instances of cell A. The first instance A 710 includes the effects of geometrical feature 902 and neighboring cell A 720. The second instance A 720 includes the effects of geometrical feature 904 and neighboring cell A 710.

The definition of cell A 710, which appears at the bottom of FIG. 9, includes cells C 740 and D 750 in addition to geometrical feature 922. Note that geometrical feature 922 affects the layout of cell C 740. Furthermore, cell C 740 can affect the layout of neighboring cell D 750, and cell D 750 can affect the layout of neighboring cell C 740. This causes the system to create an instance of the cell C 740 that includes the effects of geometrical feature 922 and neighboring cell D 750. This is the only instance created for cell C 740 because the other instance of cell C 760 under cell A 720 is the same as the instance of cell C 740 under cell A 710. The system also creates an instance of the cell D 750 that includes the effects of neighboring cell C 740.

Note that the definition of cell B 730 includes an instance of cell D 780, and this instance of cell D 780 is not affected by neighboring nodes or geometrical features defined within cell B 730. Hence, the system creates a second instance of the cell D 780 that includes no effects from neighboring cells or geometrical features.

Moreover, note that it may be possible for factors that affect cell A to also affect cells C and D. For example, if geometrical feature 902 overlaps cell C 740, another instance of cell C 740, which includes the effects of geometrical feature 902, may have to be created. Hence, it is important to create all instances of parent cell A before creating instances of a child cells C and D because the different instances of the parent cell A may create additional instances of the child cells C and D.

Note that by using an instance-based representation, a computational task can be easily partitioned so that different instances are processed by different threads. This facilitates parallel processing and/or pipelined execution for computational tasks, such as optical proximity correction and design rule checking.

The foregoing descriptions of embodiments of the invention have been presented for purposes of illustration and description only. They are not intended to be exhaustive or to limit the invention to the forms disclosed. Accordingly, many modifications and variations will be apparent to practitioners skilled in the art. Additionally, the above disclosure is not intended to limit the invention. The scope of the invention is defined by the appended claims.

What is claimed is:

1. A method for generating an instance-based representation of a set of geometrical features that comprise a layout of a circuit on a semiconductor chip, comprising:

receiving a design hierarchy specifying the layout of the circuit, including a set of hierarchically-organized nodes;

wherein a given node in the design hierarchy specifies a geometrical feature that is comprised of lower-level geometrical features that are represented by lower-level nodes that appear under the given node in the design hierarchy;

wherein the layout of the given node in the design hierarchy is specified by a first cell that specifies the layout of one or more nodes in the design hierarchy;

for each node within the design hierarchy,
determining how interactions with the node's siblings change the layout of the node as specified by the first cell,
determining how environmental attributes specified by a parent of the node change the layout of the node as specified by the first cell, and
if the changes result in a new node for which no instance has been created, creating a new instance for the node.

2. The method of claim 1, further comprising collapsing the design hierarchy, so that each node in the design hierarchy is represented by a specific node instance that is not affected by higher-level or neighboring nodes in the design hierarchy.

3. The method of claim 1, further comprising analyzing the layout by analyzing each node instance within the instance-based representation of the layout without having to consider the affects of higher-level or neighboring nodes in the design hierarchy.

4. The method of claim 3, wherein analyzing the layout involves one of:

performing design rule checking on the layout;

performing (parasitic) extraction on the layout; and performing optical proximity correction on the layout.

5. The method of claim 3, wherein analyzing the layout involves partitioning the layout so that different instances can be processed by different threads executing in parallel.

6. The method of claim 1, further comprising replacing each node in the design hierarchy with:

a holding cell that replaces the node in the design hierarchy;

a physical cell under the holding cell that specifies environmental attributes and areas of interest for the node; and an actual cell under the holding cell.

7. The method of claim 1, further comprising determining whether the instance-based representation reduces an amount of layout that must be analyzed below a threshold value, and if not, using another representation of the layout instead of the instance-based representation in subsequent analysis operations.

8. The method of claim 1, wherein the environmental attributes specified by the parent of the node include geometrical features to be added to the node and to the node's siblings.

9. The method of claim 1, wherein the design hierarchy is specified in GDSII format.

10. A computer-readable storage medium storing instructions that when executed by a computer cause the computer to perform a method for generating an instance-based representation of a set of geometrical features that comprise a layout of a circuit on a semiconductor chip, the method comprising:

receiving a design hierarchy specifying the layout of the circuit, including a set of hierarchically-organized nodes;

wherein a given node in the design hierarchy specifies a geometrical feature that is comprised of lower-level geometrical features that are represented by lower-level nodes that appear under the given node in the design hierarchy;

wherein the layout of the given node in the design hierarchy is specified by a first cell that specifies the layout of one or more nodes in the design hierarchy;

for each node within the design hierarchy,
determining how interactions with the node's siblings change the layout of the node as specified by the first cell,
determining how environmental attributes specified by a parent of the node change the layout of the node as specified by the first cell, and
if the changes result in a new node for which no instance has been created, creating a new instance for the node.

11. The computer-readable storage medium of claim 10, wherein the method further comprises collapsing the design hierarchy, so that each node in the design hierarchy is represented by a specific node instance that is not affected by higher-level or neighboring nodes in the design hierarchy.

12. The computer-readable storage medium of claim 10, wherein the method further comprises analyzing the layout by analyzing each node instance within the instance-based representation of the layout without having to consider the affects of higher-level or neighboring nodes in the design hierarchy.

13. The computer-readable storage medium of claim 12, wherein analyzing the layout involves one of:
    performing design rule checking on the layout;
    performing (parasitic) extraction on the layout; and
    performing optical proximity correction on the layout.

14. The computer-readable storage medium of claim 13, wherein analyzing the layout involves partitioning the layout so that different instances can be processed by different threads executing in parallel.

15. The computer-readable storage medium of claim 10, wherein the method further comprises replacing each node in the design hierarchy with:
    a holding cell that replaces the node in the design hierarchy;
    a physical cell under the holding cell that specifies environmental attributes and areas of interest for the node; and
    an actual cell under the holding cell.

16. The computer-readable storage medium of claim 10, wherein the method further comprises determining whether the instance-based representation reduces an amount of layout that must be analyzed below a threshold value, and if not, using another representation of the layout instead of the instance-based representation in subsequent analysis operations.

17. The computer-readable storage medium of claim 10, wherein the environmental attributes specified by the parent of the node include geometrical features to be added to the node and to the node's siblings.

18. The computer-readable storage medium of claim 10, wherein the design hierarchy is specified in GDSII format.

19. An apparatus that generates an instance-based representation of a set of geometrical features that comprise a layout of a circuit on a semiconductor chip, comprising:
    a receiving mechanism that is configured to receive a design hierarchy specifying the layout of the circuit, including a set of hierarchically-organized nodes;
    wherein a given node in the design hierarchy specifies a geometrical feature that is comprised of lower-level geometrical features that are represented by lower-level nodes that appear under the given node in the design hierarchy;
    wherein the layout of the given node in the design hierarchy is specified by a first cell that specifies the layout of one or more nodes in the design hierarchy;
    a instance generator, wherein for each node in the design hierarchy, the instance generator is configured to:
        determine how interactions with the node's siblings change the layout of the node as specified by the first cell,
        determine how environmental attributes specified by a parent of the node change the layout of the node as specified by the first cell, and to
        create a new instance for the node if the changes result in a new node for which no instance has been created.

20. The apparatus of claim 19, further comprising a collapsing mechanism that is configured to collapse the design hierarchy, so that each node in the design hierarchy is represented by a specific node instance that is not affected by higher-level or neighboring nodes in the design hierarchy.

21. The apparatus of claim 19, further comprising an analysis mechanism that is configured to analyze the layout by analyzing each node instance within the instance-based representation of the layout without having to consider the affects of higher-level or neighboring nodes in the design hierarchy.

22. The apparatus of claim 21, wherein the analysis mechanism is additionally configured to do one of:
    design rule checking on the layout;
    extraction (parasitic) on the layout; and
    optical proximity correction on the layout.

23. The apparatus of claim 21, wherein the analysis mechanism is additionally configured to partition the layout so that different instances can be processed by different threads executing in parallel.

24. The apparatus of claim 19, further comprising a replacement mechanism that is configured to replace each node in the design hierarchy with:
    a holding cell that replaces the node in the design hierarchy;
    a physical cell under the holding cell that specifies environmental attributes and areas of interest for the node; and
    an actual cell under the holding cell.

25. The apparatus of claim 19, further comprising a thresholding mechanism that is configured to determine whether the instance-based representation reduces an amount of layout that must be analyzed below a threshold value, and if not, to use another representation of the layout instead of the instance-based representation in subsequent analysis operations.

26. The apparatus of claim 19, wherein the environmental attributes specified by the parent of the node include geometrical features to be added to the node and to the node's siblings.

27. The apparatus of claim 19, wherein the design hierarchy is specified in GDSII format.

28. A means for generating an instance-based representation of a set of geometrical features that comprise a layout of a circuit on a semiconductor chip, comprising:
    a receiving means for receiving a design hierarchy specifying the layout of the circuit, including a set of hierarchically-organized nodes;
    wherein a given node in the design hierarchy specifies a geometrical feature that is comprised of lower-level geometrical features that are represented by lower-level nodes that appear under the given node in the design hierarchy;
    wherein the layout of the given node in the design hierarchy is specified by a first cell that specifies the layout of one or more nodes in the design hierarchy;
    an instance generation means, wherein for each node in the design hierarchy, the instance generation means,
        determines how interactions with the node's siblings change the layout of the node as specified by the first cell,
        determines how environmental attributes specified by a parent of the node change the layout of the node as specified by the first cell, and
        creates a new instance for the node, if the changes result in a new node for which no instance has been created.

* * * * *